United States Patent
Kikuchi et al.

(10) Patent No.: US 9,257,577 B1
(45) Date of Patent: Feb. 9, 2016

(54) LIGHT RECEIVING ELEMENT

(71) Applicant: Mitsubishi Electric Corporation, Tokyo (JP)

(72) Inventors: Matobu Kikuchi, Tokyo (JP); Masaharu Nakaji, Tokyo (JP); Ryota Takemura, Tokyo (JP); Kazuki Yamaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/682,953

(22) Filed: Apr. 9, 2015

(30) Foreign Application Priority Data

Jul. 16, 2014 (JP) .................................. 2014-145728

(51) Int. Cl.
*H01L 27/146* (2006.01)
*H01L 31/0224* (2006.01)
*H01L 31/0216* (2014.01)

(52) U.S. Cl.
CPC .. *H01L 31/022408* (2013.01); *H01L 31/02164* (2013.01)

(58) Field of Classification Search
CPC .................. H01L 31/022408; H01L 31/02164
USPC ......................................................... 257/435
See application file for complete search history.

(56) References Cited

U.S. PATENT DOCUMENTS

| 6,043,550 | A | 3/2000 | Kuhara et al. |
| 7,759,698 | B2 * | 7/2010 | Ogura ............... H01L 27/14603 257/185 |
| 2002/0113282 | A1 | 8/2002 | Yoneda et al. |
| 2010/0148216 | A1 | 6/2010 | Nakaji et al. |

FOREIGN PATENT DOCUMENTS

| JP | 2000-036615 A | 2/2000 |
| JP | 2007-088496 A | 4/2007 |
| JP | 2008-047580 A | 2/2008 |
| JP | 2010-045417 A | 2/2010 |
| JP | 2010-147158 A | 7/2010 |

* cited by examiner

*Primary Examiner* — Tu-Tu Ho
(74) *Attorney, Agent, or Firm* — Studebaker & Brackett PC

(57) ABSTRACT

A light receiving element includes a substrate of a first conduction type, a light absorbing layer of the first conduction type formed on the substrate, a diffusion layer of a second conduction type formed on a portion of the light absorbing layer, a window layer of the first conduction type formed on the light absorbing layer so as to surround the diffusion layer and having a bandgap larger than that of the light absorbing layer, an anode electrode formed on the diffusion layer, and a cathode electrode provided on the substrate so as to contact the substrate without contacting each of the window layer and the light absorbing layer, wherein a groove is formed which surrounds a boundary between the diffusion layer and the window layer as viewed in plan and extends through the window layer and the light absorbing layer as viewed in section.

5 Claims, 3 Drawing Sheets

LIGHT RECEIVING ELEMENT

BACKGROUND OF THE INVENTION

1. Field of the Invention

The present invention relates to a light receiving element for use in optical communication for example.

2. Background Art

Japanese Patent Laid-Open No. 2010-45417 discloses a light receiving element having an anode electrode on the upper surface side of a substrate, and a cathode electrode on a lower surface of the substrate. Japanese Patent Laid-Open No. 2007-88496 discloses a light receiving element having an anode electrode and a cathode electrode on the upper surface side of a substrate.

Increasing the response speed of a light receiving element requires eliminating a "current component delayed in response" which is a current component generated after a lapse of a certain time period from a time at which light enters the light receiving element. With the light receiving element disclosed in Japanese Patent Laid-Open No. 2010-45417, there is a problem that if the thickness of the substrate is increased, the distance through which carriers travel is increased and the response speed is reduced. In the light receiving element disclosed in Japanese Patent Laid-Open No. 2007-88496, the anode electrode and the cathode electrode are adjacent to each other and there is a possibility of a short circuit between the anode electrode and the cathode electrode.

SUMMARY OF THE INVENTION

The present invention has been achieved to solve the above-described problems, and an object of the present invention is to provide a light receiving element capable of having an increased response speed preventing a short circuit between the anode electrode and the cathode electrode.

The features and advantages of the present invention may be summarized as follows.

According to one aspect of the present invention, a light receiving element includes a substrate of a first conduction type, a light absorbing layer of the first conduction type formed on the substrate and having a bandgap smaller than that of the substrate, a diffusion layer of a second conduction type formed on a portion of the light absorbing layer, a window layer of the first conduction type formed on the light absorbing layer so as to surround the diffusion layer and having a bandgap larger than that of the light absorbing layer, an anode electrode formed on the diffusion layer, and a cathode electrode provided on the substrate so as to contact the substrate without contacting each of the window layer and the light absorbing layer, wherein a groove is formed which surrounds a boundary between the diffusion layer and the window layer as viewed in plan and extends through the window layer and the light absorbing layer as viewed in section.

According to another aspect of the present invention, a light receiving element includes a substrate of a first conduction type, a light absorbing layer of the first conduction type formed on the substrate and having a bandgap smaller than that of the substrate, a diffusion layer of a second conduction type formed on a portion of the light absorbing layer, a window layer of the first conduction type formed on the light absorbing layer so as to surround the diffusion layer and having a bandgap larger than that of the light absorbing layer, an anode electrode formed on the diffusion layer, a cathode electrode provided on the substrate so as to contact the substrate without contacting each of the window layer and the light absorbing layer, and an ion-implanted portion surrounding a boundary between the diffusion layer and the window layer as viewed in plan, extending through the window layer and the light absorbing layer as viewed in section, and shutting off a flow of carriers.

Other and further objects, features and advantages of the invention will appear more fully from the following description.

DETAILED DESCRIPTION OF THE PREFERRED EMBODIMENTS

A light receiving element according to embodiments of the present invention will be described with reference to the drawings. The same or corresponding components are given the same numerals and repetition of the description may be omitted.

First Embodiment

Figure 1:
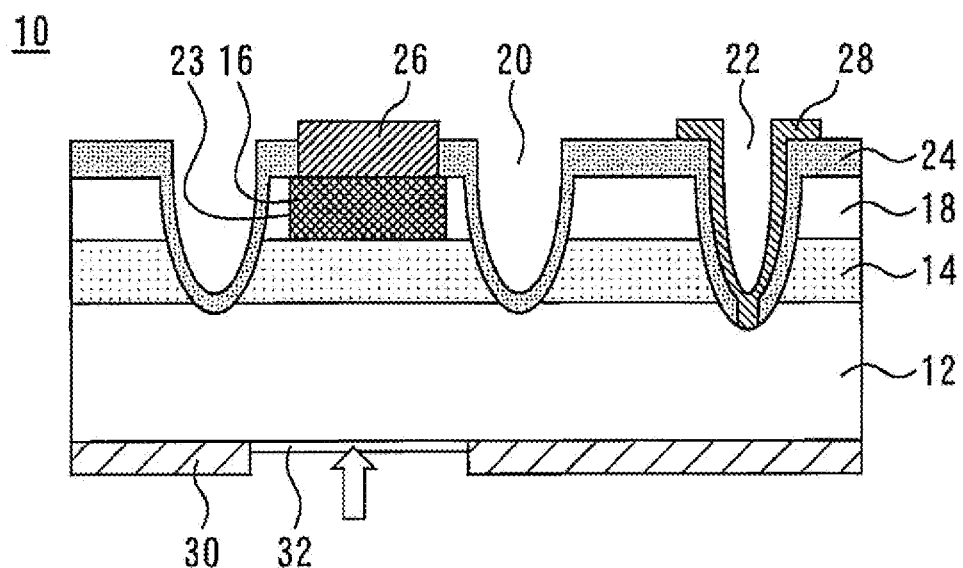
FIG. 1 is a sectional view of a light receiving element according to a first embodiment.

FIG. 1 is a sectional view of a light receiving element 10 according to a first embodiment of the present invention. The light receiving element 10 has a substrate 12 of a first conduction type. The substrate 12 is, for example, n-type InP. A light absorbing layer 14 of the first conduction type is formed on the substrate 12. The light absorbing layer 14 has a bandgap smaller than that of the substrate 12. The light absorbing layer 14 is, for example, n-type InGaAs.

A diffusion layer 16 of a second conduction type is formed on a portion of the light absorbing layer 14. The diffusion layer 16 is, for example, p-type InP. A window layer 18 of the first conduction type is formed on the light absorbing layer 14. The window layer 18 is formed so as to surround the diffusion layer 16 as viewed in plan. The window layer 18 has a bandgap larger than that of the light absorbing layer 14. The window layer 18 is, for example, n-type InP.

Grooves 20 and 22 are formed on the upper surface side of the substrate 12. The groove 20 surrounds a boundary 23 between the diffusion layer 16 and the window layer 18 as viewed in plan, and extends through the window layer 18 and the light absorbing layer 14 as viewed in section. The groove 22 is formed outside the groove 20. The groove 22 extends through the window layer 18 and the light absorbing layer 14 as viewed in section.

An insulating film 24 is formed on the upper surface side of the light receiving element 10. The insulating film 24 is formed on the upper surface of the window layer 18 and in the grooves 20 and 22. The insulating film 24 in the groove 20 abuts the window layer 18, the light absorbing layer 14 and the substrate 12. The material of the insulating film 24 is, for example, SiN.

The insulating film 24 has an opening right above the diffusion layer 16. An anode electrode 26 is formed on the diffusion layer 16. The insulating film 24 in the groove 22 has an opening in its lower end portion. A cathode electrode 28 is provided in this opening so as to contact the substrate 12. The cathode electrode 28 is provided on (above) the substrate 12. The cathode electrode 28 abuts the insulating film 24 in the groove 22 and does not contact the window layer 18 and the light absorbing layer 14. The anode electrode 26 and the cathode electrode 28 are each formed, for example, of a multilayer structure including Ti and Au, i.e., Ti/Au (the material on the left-hand side of the symbol "/" is closer to the substrate, materials shown in the same way below), Ti/Pt/Au, Pt/Ti/Pt/Au, or the like.

A portion of a lower surface of the substrate 12 is covered with a metal mask 30. The metal mask 30 is made of the material which does not transmits light. However, the metal mask 30 is formed, for example, of a multilayer structure including Ti and Au, i.e., AuGe/Ni/Ti/Pt/Au, AuZn/Ti/Pt/Au, or the like. The metal mask 30 is not formed right below the diffusion layer 16. That is, the metal mask 30 has an opening right below the diffusion layer 16. A low-reflection film 32 is formed in this opening so as to contact the lower surface of the substrate 12. The low-reflection film 32 allows light to pass therethrough without reflecting light. The low-reflection film 32 is not particularly specified in other respects. However, the low-reflection film 32 is formed, for example, an Si—$SiO_2$ multilayer structure, i.e., Si/$SiO_2$, Si/$SiO_2$/Si/$SiO_2$, or the like.

Figure 2:
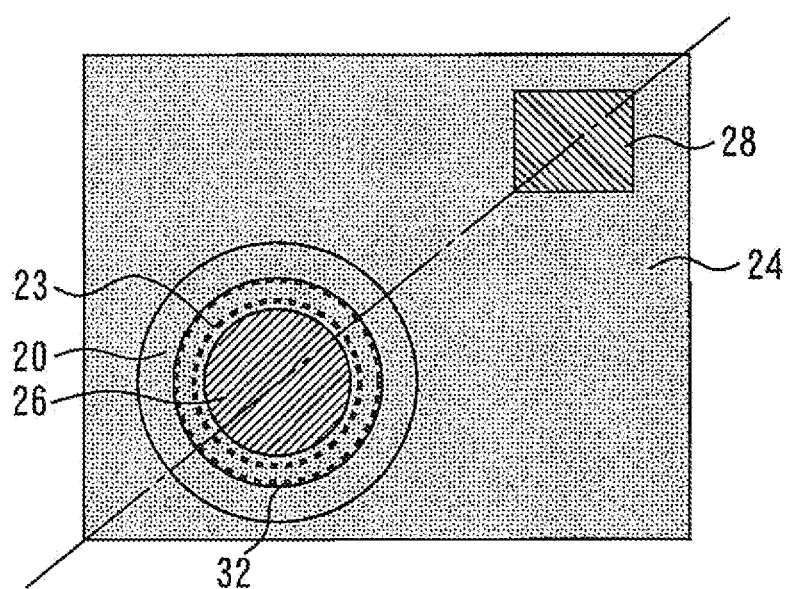
FIG. 2 is a plan view of the light receiving element.

FIG. 2 is a plan view of the light receiving element 10. The groove 20 surrounds the boundary 23 between the diffusion layer 16 and the window layer 18 as viewed in plan. The boundary 23 is indicated by a broken line. In FIG. 2, the outer circumference of the low-reflection film 32 is also indicated by a broken line. The outer circumference of the low-reflection film 32 and the inner circumference of the groove 20 are superposed on each other. FIG. 1 is a sectional view taken along a line indicated by a dot-dash line in FIG. 2.

The operation of the light receiving element 10 will be described. A reverse bias is applied to the pn junction between the diffusion layer 16 and the window layer 18 and the pn junction between the diffusion layer 16 and the light absorbing layer 14 to form a depletion layer. In this state, light enters the light receiving element 10 from a direction indicated by an arrow in FIG. 1. The light having entered generates carriers (electrons and holes) in the light absorbing layer 14. The generated carriers are accelerated by the depletion layers to flow to the anode electrode 26 or the cathode electrode 28. As a result, a current is detected.

It is preferable that when carriers are generated by light, they are rapidly detected as a current. In ordinary light receiving elements, however, the distance through which carriers generated in a place remote from the depletion layer (diffusion layer) move is long and the time taken for the carriers to move before being detected as a current is considerably long. Carriers move through a long distance and become a current component after a lapse of a certain time period from the time at which light enters the light receiving element, which means degradation in response of the light receiving element. That is, if carriers having moved through a long distance contribute to the detected current, a current component delayed in response will be generated.

In the light receiving element 10 according to the first embodiment of the present invention, however, carriers generated by light entering the element outside the region surrounded by the groove 20 cannot reach the depletion layer because of the existence of the groove 20. Therefore, even when light enters outside the region surrounded by the groove 20, carriers generated by the light do not contribute to the detected current. Thus, the generation of a current component delayed in response can be prevented.

In some cases of optical system design, the thickness of the substrate 12 is increased to a thickness of about several hundred microns for example. In such a case, if the cathode electrode is provided on the lower surface of the substrate 12, it is necessary for carriers to travel through the thick substrate, resulting in generation of a current component delayed in response. In contrast, in the light receiving element 10 according to the embodiment of the present invention, the cathode electrode 28 is provided on the upper surface side of the substrate 12, so that the carrier travel distance is not increased even when the thickness of the substrate 12 is increased, thus enabling prevention of a current component delayed in response.

Since the anode electrode 26 and the cathode electrode 28 are provided on the upper surface side of the substrate 12, mounting of the light receiving element 10 is completed by only die-bonding the element to a submount. In the case where the cathode electrode is formed on the lower surface of the substrate while the anode electrode is formed on the upper surface of the substrate, it is necessary to fix the anode electrode on the submount before wire bonding on the cathode electrode.

In the case where the cathode electrode is formed in the groove 20, there is a risk of a short circuit between the anode electrode and the cathode electrode. According to the first embodiment of the present invention, however, the problem of a short circuit between the anode electrode 26 and the cathode electrode 28 can be avoided since the groove 20 exists between these electrodes.

The light receiving element 10 according to the first embodiment of the present invention can be variously modified. For example, the outer circumference of the low-reflection film 32 (the opening of the metal mask 30) may be set larger than the inner circumference of the groove 20 since only light entering the region surrounded by the groove 20 contributes to the detected current. Thus, the entire pn junction can be used for current generation. Further, the entire lower surface of the substrate 12 may be used as a light receiving surface by omitting the metal mask 30. Thus, the amount of light blocked by the metal mask 30 can be reduced by increasing the opening of the metal mask 30 or omitting the metal mask 30, resulting in reduction of the light-electricity conversion loss.

While the first conduction type and the second conduction type are assumed to be the n-type and the p-type, respectively, the conduction types may be reversed. A buffer layer and the like may be provided between the layers. These modifications can be applied as desired to light receiving elements according to embodiments described below. The light receiving elements according to the embodiments described below have a number of commonalities with the first embodiment and will therefore be described mainly with respect to points of difference from the first embodiment.

Second Embodiment

Figure 3:
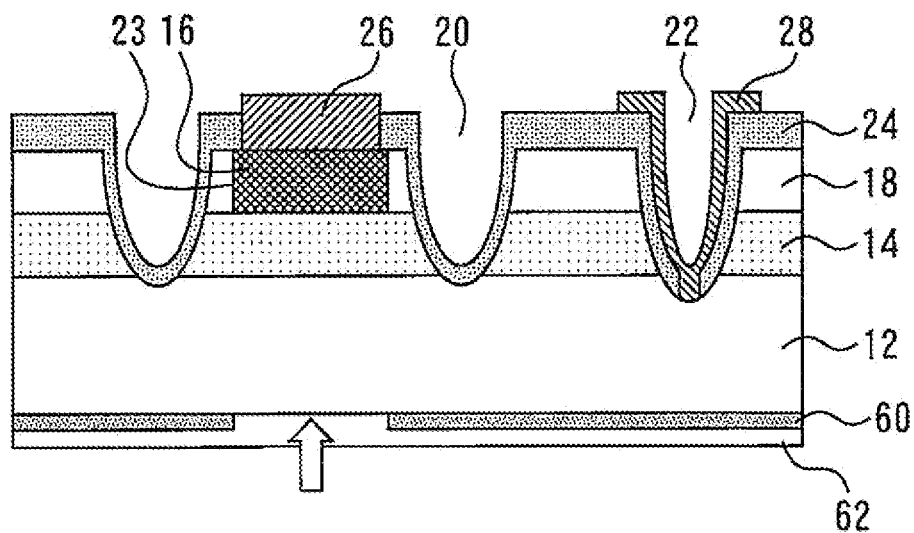
FIG. 3 is a sectional view of a light receiving element according to a second embodiment.

FIG. 3 is a sectional view of a light receiving element according to a second embodiment of the present invention. A portion of the lower surface of the substrate 12 is covered with an epitaxial layer 60. The material of the epitaxial layer 60 is not particularly limited as long as it is capable of absorbing light. However, the material of the epitaxial layer 60 is, for example, n-type InGaAs. The epitaxial layer 60 has an opening right below the diffusion layer 16. A low-reflection film 62 is formed in this opening.

The metal mask 30 in the first embodiment reflects light and there is a possibility of the reflected light interfering with the incident light. However, in the second embodiment of the present invention, such reflection of light can be prevented since the epitaxial layer 60 capable of absorbing light is formed.

Third Embodiment

Figure 4:
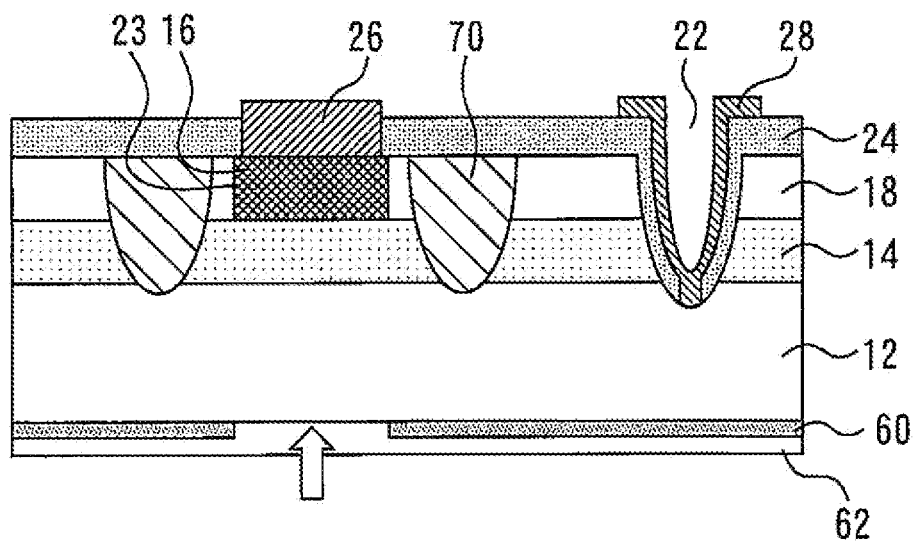
FIG. 4 is a sectional view of a light receiving element according to a third embodiment.
Figure 5:
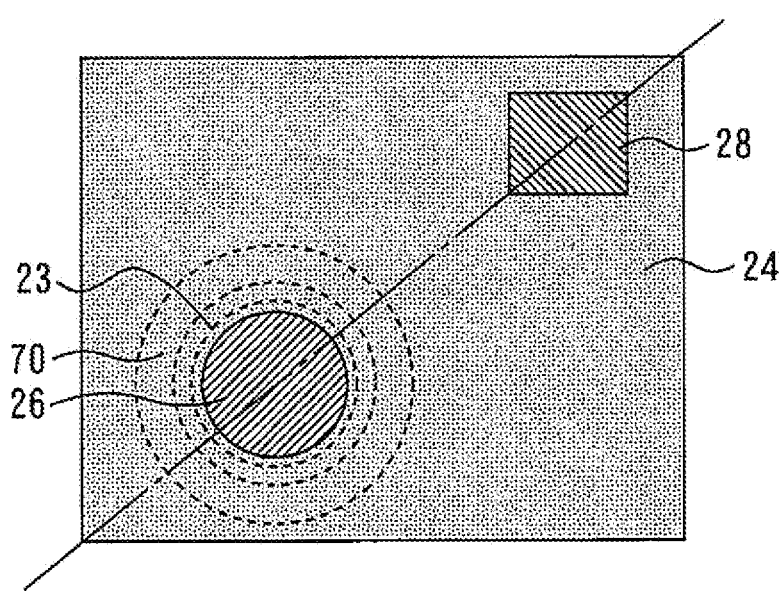
FIG. 5 is a plan view of the light receiving element shown in FIG. 4.

FIG. 4 is a sectional view of a light receiving element according to a third embodiment of the present invention. This light receiving element is provided with an ion-implanted portion 70 formed, for example, by implantation with Ti and the like. The ion-implanted portion 70 surrounds the boundary between the diffusion layer 16 and the window layer 18 as viewed in plan, and extends through the window layer 18 and the light absorbing layer 14 as viewed in section. When light enters the ion-implanted portion 70, no carriers are generated. Also, the ion-implanted portion 70 shuts off the flow of carriers. FIG. 5 is a plan view of the light receiving element shown in FIG. 4. The ion-implanted portion 70 indicated by a broken line surrounds the boundary 23 between the diffusion layer and the window layer as viewed in plan.

The ion-implanted portion 70 has the same function as that of the groove 20 in the first embodiment. In addition, the ion-implanted portion 70, can easily be made by only performing ion implantation after the window layer 18 is formed. A suitable combination of the features of the light receiving elements according to the embodiments described above may be made and used.

According to the present invention, the anode electrode and the cathode electrode are formed on the upper surface side of the substrate and a groove or an ion-implanted portion is formed between the anode electrode and the cathode electrode, thereby enabling increasing the response speed and preventing a short circuit between the anode electrode and the cathode electrode.

Obviously many modifications and variations of the present invention are possible in the light of the above teachings. It is therefore to be understood that within the scope of the appended claims the invention may be practiced otherwise than as specifically described.

What is claimed is:

1. A light receiving element comprising:
a substrate of a first conduction type;
a light absorbing layer of the first conduction type formed on the substrate and having a bandgap smaller than that of the substrate;
a diffusion layer of a second conduction type formed on a portion of the light absorbing layer;
a window layer of the first conduction type formed on the light absorbing layer so as to surround the diffusion layer and having a bandgap larger than that of the light absorbing layer;
an anode electrode formed on the diffusion layer; and
a cathode electrode provided on the substrate so as to contact the substrate without contacting each of the window layer and the light absorbing layer,
wherein a groove is formed which surrounds a boundary between the diffusion layer and the window layer as viewed in plan and extends through the window layer and the light absorbing layer as viewed in section.

2. A light receiving element comprising:
a substrate of a first conduction type;
a light absorbing layer of the first conduction type formed on the substrate and having a bandgap smaller than that of the substrate;
a diffusion layer of a second conduction type formed on a portion of the light absorbing layer;
a window layer of the first conduction type formed on the light absorbing layer so as to surround the diffusion layer and having a bandgap larger than that of the light absorbing layer;
an anode electrode formed on the diffusion layer;
a cathode electrode provided on the substrate so as to contact the substrate without contacting each of the window layer and the light absorbing layer; and
an ion-implanted portion surrounding a boundary between the diffusion layer and the window layer as viewed in plan, extending through the window layer and the light absorbing layer as viewed in section, and shutting off a flow of carriers.

3. The light receiving element according to claim 1, wherein the whole of a lower surface of the substrate is a light receiving surface.

4. The light receiving element according to claim 1, further comprising a metal mask covering a portion of a lower surface of the substrate.

5. The light receiving element according to claim 1, further comprising an epitaxial layer covering a portion of a lower surface of the substrate and capable of absorbing light.

* * * * *